| (12) | United States Patent | (10) Patent No.: | US 10,677,832 B2 |
|---|---|---|---|
| | Abadie | (45) Date of Patent: | Jun. 9, 2020 |

(54) OVER THE AIR MEASUREMENT SYSTEM AND METHOD

(71) Applicant: Rohde & Schwarz GmbH & Co. KG, Munich (DE)

(72) Inventor: Vincent Abadie, Hohenschaeftlarn (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 197 days.

(21) Appl. No.: 15/927,397

(22) Filed: Mar. 21, 2018

(65) Prior Publication Data

US 2018/0340968 A1 Nov. 29, 2018

Related U.S. Application Data

(63) Continuation-in-part of application No. 15/706,143, filed on Sep. 15, 2017, which is a continuation-in-part of application No. 15/607,317, filed on May 26, 2017.

(51) Int. Cl.

| *G01R 29/10* | (2006.01) |
|---|---|
| *H04B 17/10* | (2015.01) |
| *H04B 17/318* | (2015.01) |
| *H04B 17/21* | (2015.01) |
| *H04B 17/14* | (2015.01) |
| *G01R 29/08* | (2006.01) |

(52) U.S. Cl.
CPC ......... *G01R 29/10* (2013.01); *G01R 29/0814* (2013.01); *H04B 17/102* (2015.01); *H04B 17/103* (2015.01); *H04B 17/14* (2015.01); *H04B 17/21* (2015.01); *H04B 17/318* (2015.01)

(58) Field of Classification Search
CPC .............. G01R 33/028; G01R 31/3025; G01R 29/0878
See application file for complete search history.

(56) References Cited

U.S. PATENT DOCUMENTS

| 6,285,330 | B1 | 9/2001 | Perl | |
|---|---|---|---|---|
| 2003/0156585 | A1* | 8/2003 | Minami | ................... G01C 9/00 |
| | | | | 370/389 |
| 2008/0067397 | A1* | 3/2008 | Tsukihara | ............... H01J 37/04 |
| | | | | 250/396 ML |

(Continued)

FOREIGN PATENT DOCUMENTS

| EP | 2194387 A1 | 6/2010 |
|---|---|---|
| WO | WO2009038388 A1 | 3/2009 |

*Primary Examiner* — Alvaro E Fortich

(74) *Attorney, Agent, or Firm* — Potomac Technology Law, LLC

(57) ABSTRACT

An over-the-air measurement system is provided for analyzing a device under test. The over-the-air measurement system includes a first measurement unit, a first antenna connected to the first measurement unit, a second measurement unit, and a second antenna connected to the second measurement unit. The first measurement unit is configured to establish a communication link, within a communication link frequency range, to the device under test via the first antenna. The second measurement unit is configured to measure radio frequency radiation, within a measurement frequency range, of the device under test via the second antenna. The communication link frequency range and the measurement frequency range do not overlap each other.

16 Claims, 3 Drawing Sheets

(56) References Cited

U.S. PATENT DOCUMENTS

| | | | |
|---|---|---|---|
| 2011/0043418 A1* | 2/2011 | Teshirogi | G01R 29/0821 343/703 |
| 2011/0115683 A1* | 5/2011 | Herrmann | G01R 29/10 343/760 |
| 2012/0038522 A1 | 2/2012 | Miyata | |
| 2012/0137779 A1 | 6/2012 | Graff et al. | |
| 2015/0346314 A1 | 12/2015 | Underbrink et al. | |
| 2016/0359718 A1* | 12/2016 | Banerjee | H04L 43/50 |

\* cited by examiner

OVER THE AIR MEASUREMENT SYSTEM AND METHOD

RELATED APPLICATIONS

This application is a Continuation-in-Part and claims the benefit of the earlier filing date under 35 U.S.C. § 120 from U.S. patent application Ser. No. 15/706,143 (filed 2017 Sep. 15), which is a Continuation-in-Part and claims the benefit of the earlier filing date under 35 U.S.C. § 120 from U.S. patent application Ser. No. 15/607,317 (filed 2017 May 26), the entireties of which are incorporated by reference herein.

TECHNICAL FIELD

The invention relates to an over-the-air measurement system and an over-the-air measurement method for wirelessly investigating a device under test, thereby ensuring measurement efficiency and accuracy.

BACKGROUND

Generally, in times of an increasing number of applications providing wireless connectivity capabilities, there is a growing need of an over-the-air measurement system and a corresponding over-the-air measurement method especially in order to verify the proper functioning of the applications in an efficient and accurate manner.

The publication US20110043418A1 relates to a method for measuring a radiation power generated from a device under test from an output of a measurement antenna, wherein the device under test is arranged in an ellipsoid enclosed space such that a radiation center of the radio wave is substantially coincided with the neighborhood of a first focal point. The radio wave radiated from the device under test and reflected from the wall surface is received by a receiving antenna arranged in the neighborhood a second focal point thereby to measure the total radiated power of the device under test from the output signal of the receiving antenna. One of the device under test and the receiving antenna is moved along the axis passing through the first and second focal points, and based on the measurement value maximizing the output signal power of the receiving antenna, calculating the total radiated power of the device under test. Due to the complex measurement setup, however, measurements are expensive, and thus not efficient, whereby a high accuracy cannot even be ensured because of an error-prone adjustment of the device under test with respect to the focal points.

Accordingly, there is a need for an over-the-air measurement approach for wirelessly investigating a device under test, whereby measurement efficiency and accuracy are ensured.

SOME EXAMPLE EMBODIMENTS

Embodiments of the present invention advantageously address the foregoing requirements and needs, as well as others, by providing an over-the-air measurement system and an over-the-air measurement method for wirelessly investigating a device under test, whereby measurement efficiency and accuracy are ensured.

According to a first aspect of the invention, an over-the-air measurement system for investigating a device under test is provided. The over-the-air measurement system comprises a first measurement unit, a first antenna connected to the first measurement unit, a second measurement unit, and a second antenna connected to the second measurement unit. In this context, the first measurement unit is configured to establish a communication link to the device under test with the aid of the first antenna within a communication link frequency range, whereas the second measurement unit is configured to measure a radio frequency radiation of the device under test with the aid of the second antenna within a measurement frequency range. In addition to this, the communication link frequency range and the measurement frequency range do not overlap each other. Advantageously, expensive filtering is not required for accurate measurements.

According to a first implementation form of the over-the-air measurement system of the first aspect, the communication link comprises at least one uplink channel and at least one downlink channel. Advantageously, multifaceted measurements can be performed.

According to a further implementation form of the over-the-air measurement system of the first aspect, the communication link frequency range and the measurement frequency range are adjacent to each other with a frequency gap. Advantageously, measurement errors can further be reduced.

According to a further implementation form of the over-the-air measurement system of the first aspect, the first measurement unit comprises the second measurement unit. Advantageously, complexity, and thus costs, can further be reduced.

According to a further implementation form of the over-the-air measurement system of the first aspect, the over-the-air measurement system further comprises a positioning unit configured to position the device under test with respect to the first antenna and/or the second antenna. Advantageously, the antenna can be adjusted especially in order to measure off center of a radio frequency beam.

According to a further implementation form of the over-the-air measurement system of the first aspect, the over-the-air measurement system further comprises a radio frequency reflector configured to reflect, and/or to parallelize, radio frequency beams emitted by the first antenna and/or the second antenna. Advantageously, accuracy and efficiency can further be increased.

According to a further implementation form of the over-the-air measurement system of the first aspect, the first measurement unit is configured to transmit a beam lock command to the device under test with the aid of the first antenna. Additionally or alternatively, the second measurement unit is configured to transmit a beam lock command to the device under test with the aid of the second antenna. Advantageously, measurement accuracy can further be increased.

According to a further implementation form of the over-the-air measurement system of the first aspect, the first measurement unit and the second measurement unit are configured to exchange their functionality with respect to each other. Advantageously, measurement efficiency can further be increased.

According to a further implementation form of the over-the-air measurement system of the first aspect, with respect to the device under test, at least one of the first antenna and the second antenna is placed in near-field or far-field. Advantageously, near-field and/or far-field characteristics can accurately be investigated.

According to a second aspect of the invention, an over-the-air measurement method for investigating a device under test is provided. The over-the-air measurement method comprises the steps of establishing a communication link to the device under test with the aid of a first antenna connected to a first measurement unit within a communication link frequency range, and measuring a radio frequency radiation of the device under test with the aid of a second antenna connected to a second measurement unit within a measurement frequency range. In this context, the communication link frequency range and the measurement frequency range do not overlap each other. Advantageously, expensive filtering is not required for accurate measurements.

According to a first implementation form of the over-the-air measurement method of the second aspect, the communication link comprises at least one uplink channel and at least one downlink channel. Advantageously, multifaceted measurements can be performed.

According to a further implementation form of the over-the-air measurement method of the second aspect, the communication link frequency range and the measurement frequency range are adjacent to each other with a frequency gap. Advantageously, measurement errors can be further reduced.

According to a further implementation form of the over-the-air measurement method of the second aspect, the first measurement unit comprises the second measurement unit. Advantageously, complexity, and thus costs, can further be reduced.

According to a further implementation form of the over-the-air measurement method of the second aspect, the over-the-air measurement method further comprises the step of positioning the device under test with respect to the first antenna and/or the second antenna with the aid of a positioning unit. Advantageously, the antenna can be adjusted especially in order to measure off center of a radio frequency beam.

According to a further implementation form of the over-the-air measurement method of the second aspect, the over-the-air measurement method further comprises the step of reflecting and/or parallelizing radio frequency beams emitted by the first antenna and/or the second antenna with the aid of a radio frequency reflector. Advantageously, accuracy and efficiency can further be increased.

According to a further implementation form of the over-the-air measurement method of the second aspect, the over-the-air measurement method further comprises the step of transmitting a beam lock command to the device under test with the aid of the first antenna connected to the first measurement unit. Additionally or alternatively, the over-the-air measurement method further comprises the step of transmitting a beam lock command to the device under test with the aid of the second antenna connected to the second measurement unit. Advantageously, measurement accuracy can further be increased.

According to a further implementation form of the over-the-air measurement method of the second aspect, the over-the-air measurement method further comprises the step of exchanging the functionality of the first measurement unit and the second measurement unit with respect to each other. Advantageously, measurement efficiency can further be increased.

According to a further implementation form of the over-the-air measurement method of the second aspect, the over-the-air measurement method further comprises the step of placing at least one of the first antenna and the second antenna in near-field or far-field with respect to the device under test. Advantageously, near-field and/or far-field characteristics can accurately be investigated.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

Embodiments of the present invention are illustrated by way of example, and not by way of limitation, in the figures of the accompanying drawings, in which like reference numerals refer to similar elements, and in which.

DETAILED DESCRIPTION

An over-the-air measurement system and an over-the-air measurement method for wirelessly investigating a device under test, whereby measurement efficiency and accuracy are ensured, are described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

A processor, unit, module or component (as referred to herein) may be composed of software component(s), which are stored in a memory or other computer-readable storage medium, and executed by one or more processors or CPUs of the respective devices. A module or unit may alternatively be composed of hardware component(s) or firmware component(s), or a combination of hardware, firmware and/or software components. Further, with respect to the various example embodiments described herein, while certain of the functions are described as being performed by certain components or modules (or combinations thereof), such descriptions are provided as examples and are thus not intended to be limiting. Accordingly, any such functions may be envisioned as being performed by other components or modules (or combinations thereof), without departing from the spirit and general scope of the present invention. Moreover, the methods, processes and approaches described herein may be processor-implemented using processing circuitry that may comprise one or more microprocessors, application specific integrated circuits (ASICs), field programmable gate arrays (FPGAs), or other devices operable to be configured or programmed to implement the systems and/or methods described herein. For implementation on such devices that are operable to execute software instructions, the flow diagrams and methods described herein may be implemented in processor instructions stored in a computer-readable medium, such as executable software stored in a computer memory store.

Figure 1:
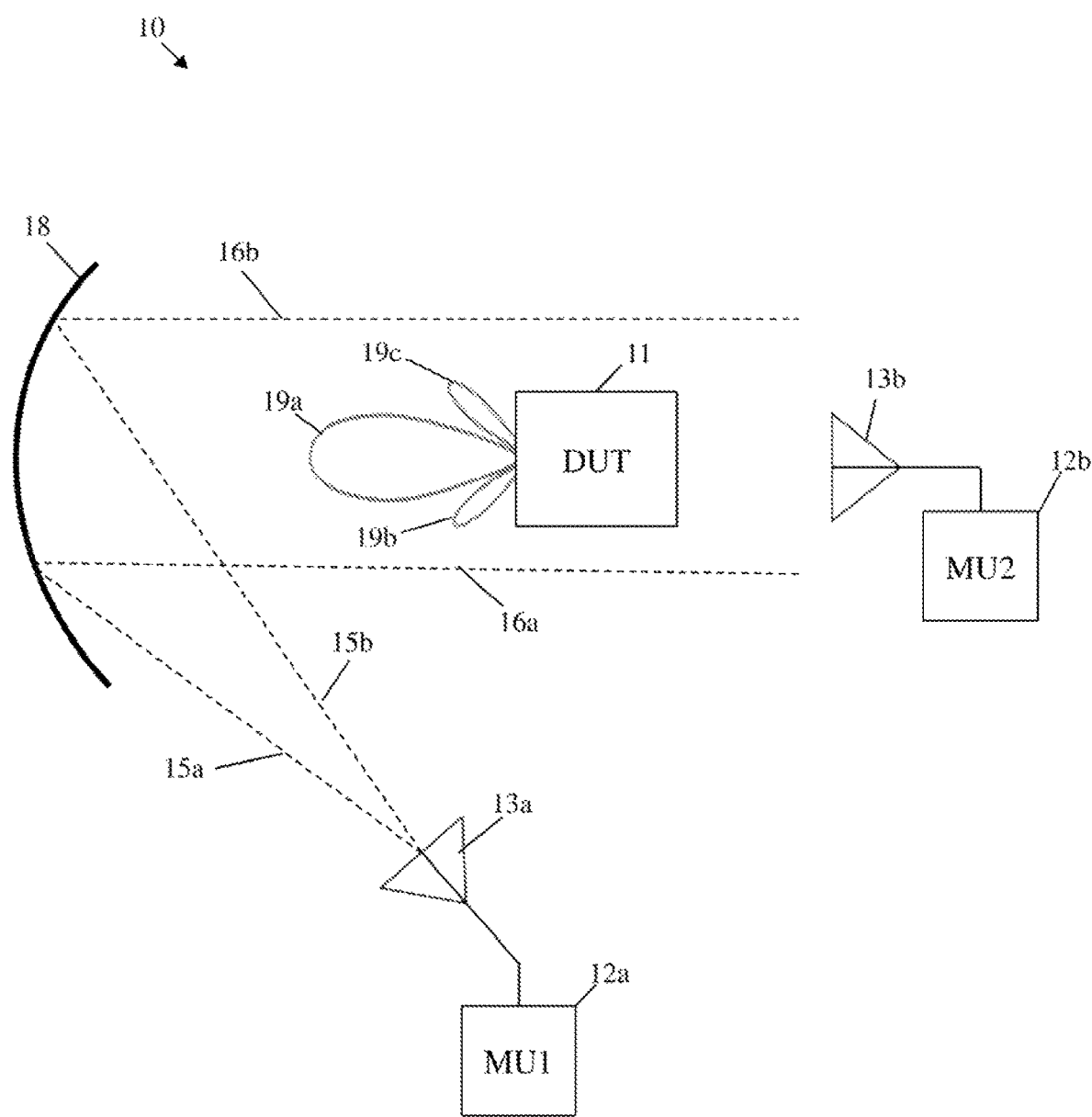
FIG. 1 shows an example over-the-air measurement system, in accordance with example embodiments of the present invention.

FIG. 1 shows an example over-the-air measurement system 10 for analyzing a device under test (DUT) 11, in accordance with example embodiments of the present invention. The over-the-air measurement system 10 comprises a first measurement unit 12a, a first antenna 13a connected to the first measurement unit 12a, a second measurement unit 12b, and a second antenna 13b connected to the second measurement unit 12b. Further, the over-the-air measurement system 10 comprises a reflector 18 (e.g., a reflector of parabolic shape) for reflecting or deflecting, respectively, radio frequency beams 15a, 15b, for example, emitted by the first antenna 13a. Additionally or alternatively, the reflector 18 may also reflect or deflect radio frequency beams emitted by the device under test 11 and/or by the second antenna 13b.

Further, the first measurement unit 12a may be configured to establish a communication link to the device under test 11 with the aid of the first antenna 13a within a communication link frequency range, whereas the second measurement unit 12b may be configured to measure a radio frequency radiation of the device under test 11 with the aid of the second antenna 13b within a measurement frequency range. By way of example, the communication link frequency range and the measurement frequency range do not overlap each other. By way of further example, the communication link may comprise at least one uplink channel and at least one downlink channel. By way of further example, the communication link frequency range and the measurement frequency range may additionally or alternatively be adjacent to each other with a frequency gap. By way of further example, the first measurement unit 12a may contain the second measurement unit 12b.

The over-the-air measurement system 10 may further comprise a positioning unit configured to position the device under test 11 with respect to the first antenna 13a and/or the second antenna 13b (the positioning unit is described in further detail below with reference to FIG. 2). By way of example, with the aid of the positioning unit, the device under test 11 can be moved in order to measure off center of at least one radio frequency beam. In this context, the at least one radio frequency beam may be emitted by at least one of the first antenna 13a and the second antenna 13b.

As further illustrated by FIG. 1, the radio frequency reflector 18 may further be configured to reflect and/or parallelize the radio frequency beams 15a, 15b emitted by the first antenna 13a, which leads to parallelized beams 16a, 16b. Additionally or alternatively, the radio frequency reflector 18 may further be configured to parallelize radio frequency beams emitted by the second antenna 13b and/or by the device under test 11.

FIG. 1 further illustrates a radio frequency beam emitted by the device under test 11, which may comprise a main lobe 19a and two side lobes 19b, 19c. By way of example, the first measurement unit 12a may be configured to transmit a beam lock command to the device under test 11 with the aid of the first antenna 13a. By way of further example, the second measurement unit 12b may additionally or alternatively be configured to transmit a beam lock command to the device under test 11 with the aid of the second antenna 13b.

Further, the first measurement unit 12a and the second measurement unit 12b may be configured to exchange their functionality with respect to each other. In other words, after the measurement units 12a, 12b have exchanged their functionality, the first measurement unit 12a may be configured to measure the radio frequency radiation of the device under test 11 with the aid of the first antenna 13a within the measurement frequency range. By way of example, the second antenna 13b may be viewed as a downlink and/or uplink antenna after the exchange. Advantageously, the respective downlink channel does not disturb the measurement. By way of further example, before the exchange of functionality with respect to the measurement units 12a, 12b, the first antenna 13a may be viewed as downlink and/or uplink antenna. By way of further example, the first antenna 13a may additionally or alternatively be viewed as a steering antenna before the exchange of functionality. By way of further example, the respective beam preferably emitted by the device under test 11 (e.g., during the exchange of functionality) may be locked with the aid of the above-mentioned lock command.

Further, with respect to the device under test 11, at least one of the first antenna 13a and the second antenna 13b may be placed in near-field or far-field.

Figure 2:
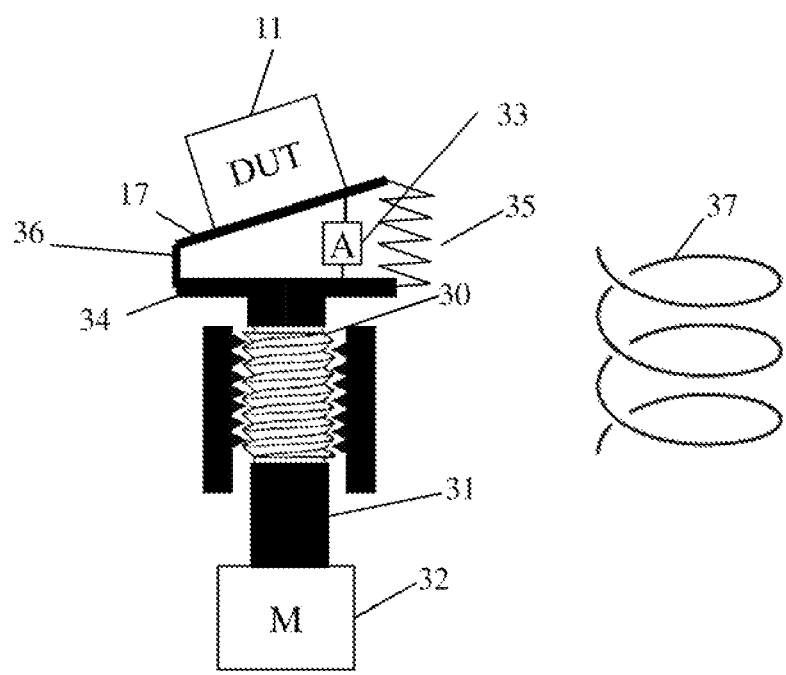
FIG. 2 shows an example positioner to mount the device under test and to adjust the position of the device under test, within an example over-the-air measurement system, in accordance with example embodiments of the present invention.

FIG. 2 shows an example positioning unit configured to mount the device under test 11 and to adjust the position of the device under test, within an example over-the-air measurement system, in accordance with example embodiments of the present invention.

According to one embodiment, a first support member 17, which is configured to incorporate or hold the device under test 11, is connected to a hinge 36 that is connected to a second support member 34 attached to a first end of a rod 31, wherein the rod 31 comprises a thread 30 for moving the second support member 34 up and down, for example, with the aid of a motor 32 attached to a second end of the rod 31. By way of example, rotating the rod 31 with the aid of the motor 32 adjusts the height of the second support member 34, and thereby also adjusts the height of the first support member 17 and the device under test 11.

According to a further embodiment, the first support member 17 is attached to an actuator 33 in a tiltable manner with respect the second support member 34, for example, via the hinge 36. By way of example, operation of the actuator tilts the first support member 17 with respect to the second support member 34 (via or about the hinge 36), and thereby also tilts the device under test 11 with respect to the second support member 34.

Further, a shielding of the device under test 11 may be effectuated by the second support member 34, the hinge 36 or similar element, to allow for tilting the first support member 17 with respect to the second support member 34. By way of example, a flexible shielding material 35 may be connected to one end of the second support member 34 and to one end of the first support member 17.

FIG. 2 further illustrates an example trace 37 of movement of the device under test 11 in the case that the device under test 11 is moved down in a tilted condition, which leads to the helical trace 37.

Figure 3:
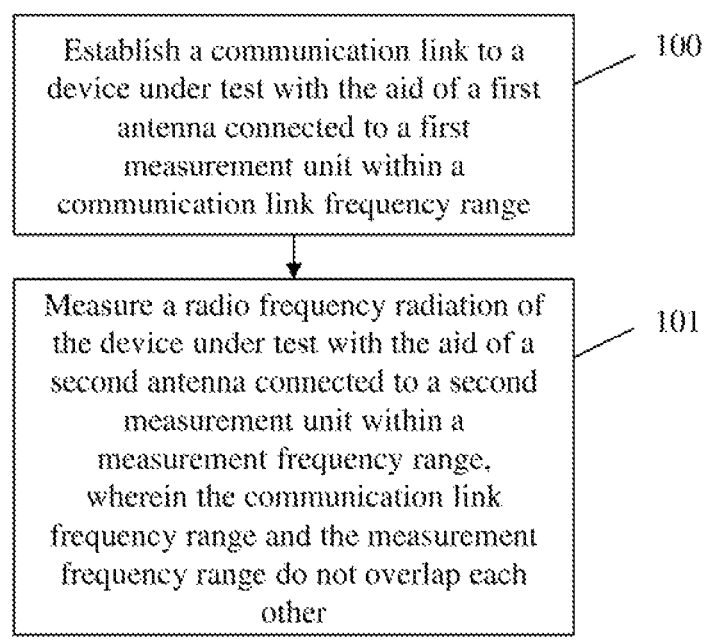
FIG. 3 shows a flow chart of an example over-the-air measurement method, in accordance with example embodiments of the present invention.

FIG. 3 shows a flow chart of an example over-the-air measurement method, in accordance with example embodiments of the present invention. In step 100, a communication link is established to a device under test with the aid of a first antenna connected to a first measurement unit within a communication link frequency range. In step 101, a radio frequency radiation of the device under test is measured with the aid of a second antenna connected to a second measurement unit within a measurement frequency range, wherein the communication link frequency range and the measurement frequency range do not overlap each other.

By way of example, the communication link may comprise at least one uplink channel and at least one downlink channel. By way of further example, the communication link frequency range and the measurement frequency range may be adjacent to each other with a frequency gap. By way of further example, the first measurement unit may contain the second measurement unit.

Additionally or alternatively, the over-the-air measurement method may further comprise the step of positioning the device under test with respect to the first antenna and/or the second antenna with the aid of a positioning unit.

Additionally or alternatively, the over-the-air measurement method may further comprise the step of reflecting and/or parallelizing radio frequency beams emitted by the first antenna and/or the second antenna with the aid of a radio frequency reflector.

Additionally or alternatively, the over-the-air measurement method may further comprise the step of transmitting a beam lock command to the device under test with the aid of the first antenna connected to the first measurement unit.

Additionally or alternatively, the over-the-air measurement method may further comprise the step of transmitting a beam lock command to the device under test with the aid of the second antenna connected to the second measurement unit.

Additionally or alternatively, the over-the-air measurement method may further comprise the step of exchanging the functionality of the first measurement unit and the second measurement unit with respect to each other.

Additionally or alternatively, the over-the-air measurement method may further comprise the step of placing at least one of the first measurement unit and the second measurement unit in near-field or far-field with respect to the device under test.

While various embodiments of the present invention have been described above, it should be understood that they have been presented by way of example only, and not limitation. Numerous changes to the disclosed embodiments can be made in accordance with the disclosure herein without departing from the spirit or scope of the invention. For example, a current may be measured instead of a voltage. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An over-the-air measurement system for analyzing a device under test, the over-the-air measurement system comprising:
   a first measurement unit;
   a first antenna connected to the first measurement unit;
   a second measurement unit;
   a second antenna connected to the second measurement unit; and
   a radio frequency reflector; and
   wherein the radio frequency reflector is configured to reflect and parallelize radio frequency beams emitted by one or both of the first antenna and the second antenna,
   wherein the first measurement unit is configured to establish a communication link, within a communication link frequency range, to the device under test via the first antenna,
   wherein the second measurement unit is configured to measure radio frequency radiation, within a measurement frequency range, of the device under test via the second antenna, and
   wherein the communication link frequency range and the measurement frequency range do not overlap each other.

2. The over-the-air measurement system according to claim 1, wherein the communication link comprises at least one uplink channel and at least one downlink channel.

3. The over-the air measurement system according to claim 1, wherein the communication link frequency range and the measurement frequency range are adjacent to each other with a frequency gap.

4. The over-the-air measurement system according to claim 1, wherein the first measurement unit comprises the second measurement unit.

5. The over-the-air measurement system according to claim 1, further comprising:
   a positioning unit configured to position the device under test with respect to one or more the first antenna and the second antenna.

6. The over-the-air measurement system according to claim 1, comprising one or more of the following configurations:
   the first measurement unit is configured to transmit a beam lock command to the device under test with the aid of the first antenna; and
   the second measurement unit is configured to transmit a beam lock command to the device under test with the aid of the second antenna.

7. The over-the-air measurement system according to claim 1, wherein the first measurement unit and the second measurement unit are configured to exchange functionality with respect to each other.

8. The over-the-air measurement system according to claim 1, wherein at least one of the first antenna and the second antenna is positioned in a near-field or a far-field with respect to the device under test.

9. An over-the-air measurement method for analyzing a device under test, the over-the-air measurement method comprising:
   establishing, via a first antenna connected to a first measurement unit, a communication link to the device under test within a communication link frequency range;
   measuring, via a second antenna connected to a second measurement unit, radio frequency radiation of the device under test within a measurement frequency range; and
   reflecting and parallelizing, via a radio frequency reflector, radio frequency beams emitted by one or both of the first antenna and the second antenna; and
   wherein the communication link frequency range and the measurement frequency range do not overlap each other.

10. The over-the-air measurement method according to claim 9, wherein the communication link comprises at least one uplink channel and at least one downlink channel.

11. The over-the air measurement method according to claim 9, wherein the communication link frequency range and the measurement frequency range are adjacent to each other with a frequency gap.

12. The over-the-air measurement method according to claim 9, wherein the first measurement unit comprises the second measurement unit.

13. The over-the-air measurement method according to claim 9, further comprising:
   positioning, via a positioning device, the device under test with respect to one or more of the first antenna and the second antenna.

14. The over-the-air measurement method according to claim 9, further comprising one or more of:
   transmitting, via the first antenna connected to the first measurement unit, a beam lock command to the device under test; and
   transmitting, via the second antenna connected to the second measurement unit, a beam lock command to the device under test.

15. The over-the-air measurement method according to claim 9, further comprising:
   the first measurement unit and the second measurement exchanging functionality with respect to each other.

16. The over-the-air measurement method according to claim 9, wherein at least one of the first antenna and the second antenna is positioned in a near-field or a far-field with respect to the device under test.

* * * * *